United States Patent
Yeung et al.

(10) Patent No.: US 8,185,810 B1
(45) Date of Patent: May 22, 2012

(54) LOW POWER VITERBI TRACE BACK ARCHITECTURE

(75) Inventors: Kwok Alfred Yeung, Milpitas, CA (US); Xin-Ning Song, San Jose, CA (US); Paul K. Lai, San Jose, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 1439 days.

(21) Appl. No.: 11/787,142

(22) Filed: Apr. 13, 2007

(51) Int. Cl.
*H03M 13/41* (2006.01)

(52) U.S. Cl. ........................................... 714/795

(58) Field of Classification Search .................... 714/795
See application file for complete search history.

(56) References Cited

U.S. PATENT DOCUMENTS

| | | | | |
|---|---|---|---|---|
| 5,257,263 A * | 10/1993 | Bazet et al. | ................ | 714/795 |
| 5,329,537 A * | 7/1994 | Alard et al. | ................ | 714/794 |
| 5,712,880 A * | 1/1998 | Rim et al. | ................ | 375/341 |
| 5,822,341 A * | 10/1998 | Winterrowd et al. | ......... | 714/795 |
| 5,878,092 A * | 3/1999 | Choi | ................ | 375/341 |
| 5,928,378 A * | 7/1999 | Choi | ................ | 714/795 |
| 5,930,298 A * | 7/1999 | Choi | ................ | 375/262 |
| 5,987,637 A * | 11/1999 | Thomas | ................ | 714/795 |
| 6,075,822 A * | 6/2000 | Oh | ................ | 375/262 |
| 6,333,954 B1 * | 12/2001 | Hansquine | ................ | 375/341 |
| 6,334,201 B1 * | 12/2001 | Sawaguchi et al. | ........... | 714/795 |
| 6,337,890 B1 * | 1/2002 | Maru | ................ | 375/341 |
| 6,601,215 B1 * | 7/2003 | Thurnhofer | ................ | 714/795 |
| 6,697,442 B1 * | 2/2004 | Todoroki | ................ | 375/341 |
| 6,725,418 B2 * | 4/2004 | Sawaguchi et al. | ........... | 714/795 |
| 7,035,356 B1 * | 4/2006 | Langhammer | ................ | 375/341 |

* cited by examiner

*Primary Examiner* — Stephen Baker

(74) *Attorney, Agent, or Firm* — Van Pelt, Yi & James LLP

(57) ABSTRACT

A method of obtaining a Viterbi decoded value is disclosed. A decision output is stored to one of a plurality of buffer elements, wherein at least one other buffer element in the plurality is not changing; and data is exposed in the buffer element. A plurality of stored decision outputs is obtained from the plurality of buffers elements. The obtained plurality of stored decision outputs is processed to obtain a Viterbi decoded value.

22 Claims, 5 Drawing Sheets

LOW POWER VITERBI TRACE BACK ARCHITECTURE

BACKGROUND OF THE INVENTION

Viterbi decoding is used to decode convolutional codes in digital communications and storage technologies. These technologies find wide application, including mobile and consumer applications, where power consumption is minimized to conserve battery life and reduce heat emission, and where the decoder latency cannot be increased substantially. Therefore, there exists a need for low power and low latency Viterbi decoding techniques.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
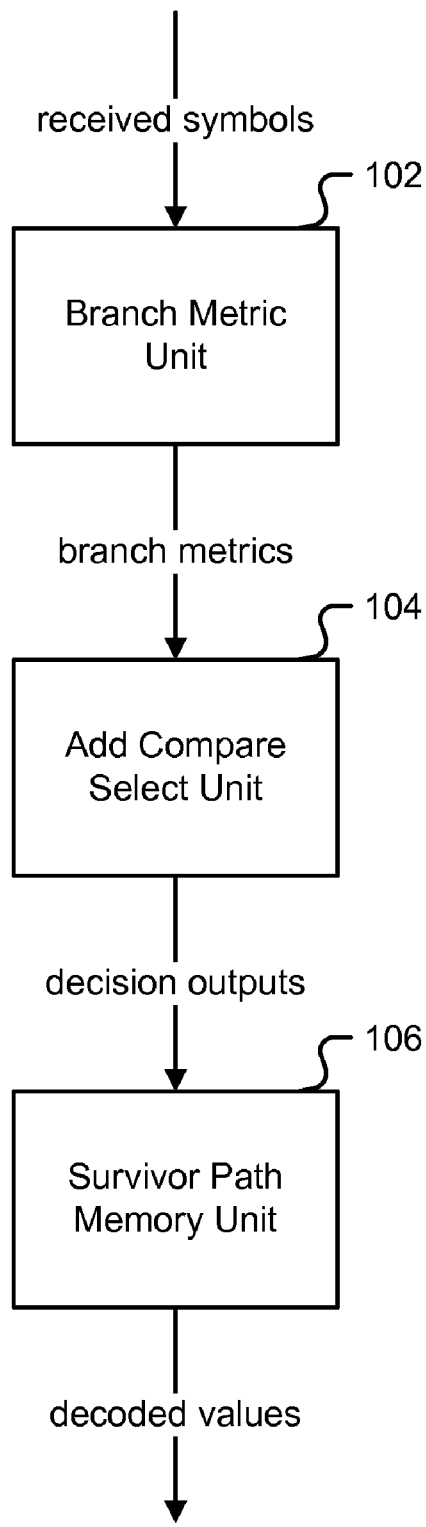
FIG. 1 is a block diagram illustrating an embodiment of a typical Viterbi decoding process.

FIG. 1 is a block diagram illustrating an embodiment of a typical Viterbi decoding process. In the example shown, received symbols are processed by a Branch Metric unit 102, which generates branch metrics. The branch metrics are processed by an Add Compare Select unit ("ACS") 104, which generates decision outputs. The decision outputs are processed by a Survivor Path Memory unit ("SPM") 106, which generates the final Viterbi decoded values. There exist two popular techniques for performing the function of SPM 106, the register exchange technique and the traceback technique. A low power and/or low latency technique to perform the function of SPM 106 is disclosed.

Figure 2A:
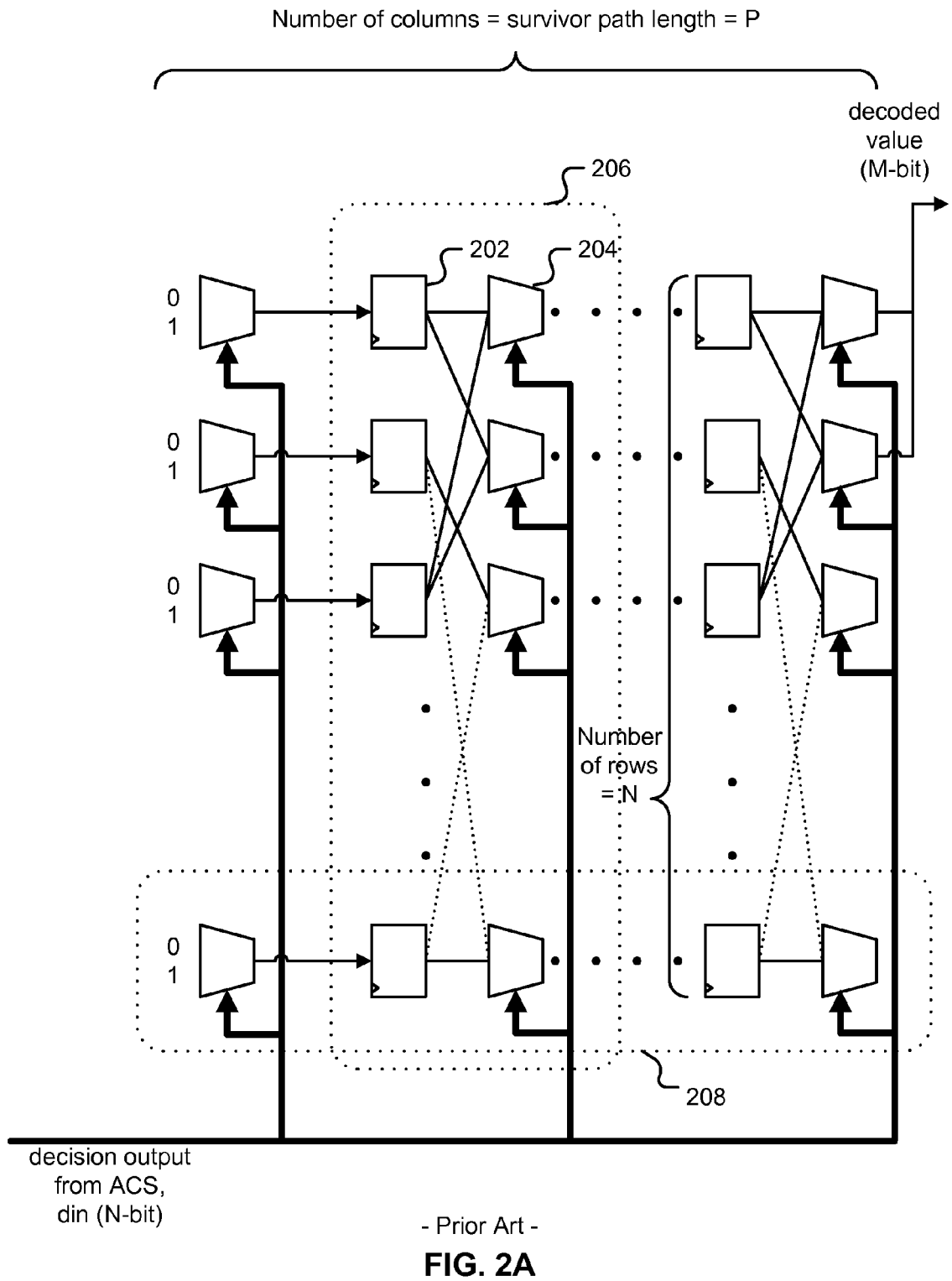
FIG. 2A is a block diagram illustrating an embodiment of an SPM unit using the popular register exchange technique.

FIG. 2A is a block diagram illustrating an example of an SPM unit using the register exchange technique. In some systems, the register exchange system of FIG. 2A is included in unit 106 of FIG. 1. In the example shown, 1-bit register 202 and multiplexer 204 are cells for a register exchange array for a 1-bit decoded value. The cells are arranged in register exchange columns (e.g., column 206) with a trellis of interconnections based on the underlying Viterbi code. In this example, the number of register exchange columns used is equal to the survivor path length, P, of the underlying Viterbi code. The trellis and cells are also arranged in register exchange rows (e.g., row 208). The number of register exchange rows depends on the number of bits, N, in each decision output from the ACS 104.

In the example shown, the registers in the left-most register exchange column 206 are set to a preassigned value. The decision outputs from ACS 104 are used to configure the multiplexers 204 on a one-to-one bit basis. For example, the first bit of the decision output might configure all of the multiplexers 204 in the top register exchange row 208. After each clock cycle, a new decision output from the ACS 104 is allowed to alter the multiplexers 204 in the register exchange array, and the register outputs are propagated from left to right throughout the register exchange array. After P clock cycles, where P is the survivor path length of the Viterbi decoder, an M-bit Viterbi decoded value is generated from the register exchange array.

The register exchange technique performs the function of SPM 106 with little latency, because the optimum decoded value is output as soon as the last decision output from the ACS 104 is received. The tradeoff is that the register exchange technique consumes a large amount of power, because of the N×P registers clocked every cycle and the large loading on the ACS decision outputs.

Figure 2B:
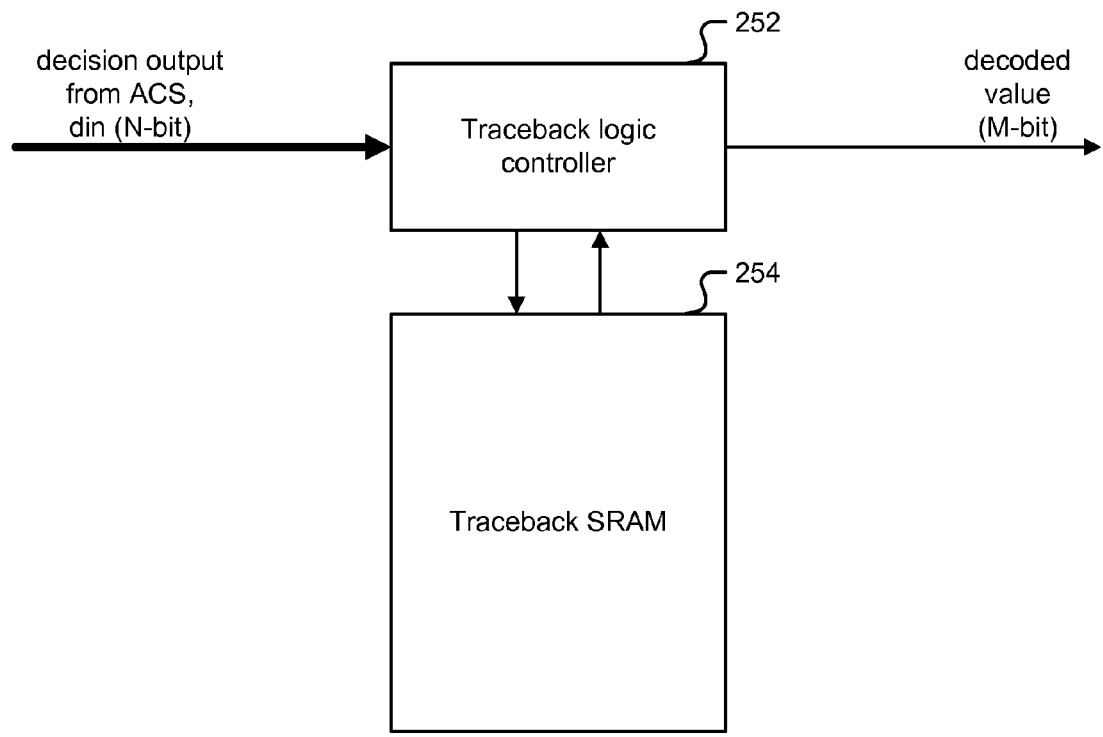
FIG. 2B is a block diagram illustrating an embodiment of an SPM unit using the popular traceback technique.

FIG. 2B is a block diagram illustrating an example of an SPM unit using the traceback technique. In some embodiments, the traceback system of FIG. 2B is included in unit 106 of FIG. 1. In the example shown, traceback logic controller 252 receives the N-bit decision outputs from the ACS and stores it in static random access memory ("SRAM"), called the traceback SRAM 254. After P decision outputs have been received and stored from the ACS 104, the traceback logic controller 252 then can use the stored decision outputs in reverse order to determine the M-bit decoded value.

The traceback technique performs the function of SPM 106 with a high latency, because the optimum decoded value must wait for the traceback logic controller 252 to traverse the traceback SRAM 254 in reverse through P decision outputs. The latency can be considered to be longer than that of the register exchange technique. The traceback technique can result in lower power and smaller area if implemented properly.

What is disclosed is a technique for performing the functionality of a SPM unit that has both low latency and/or low power. For example, although the low power of the traceback unit shown in FIG. 2B may be attractive, its relatively long latency may be unattractive. Similarly, the register exchange unit of FIG. 2A may be sufficiently fast but may consume more power than is desired. The following figure illustrates one embodiment.

Figure 3:
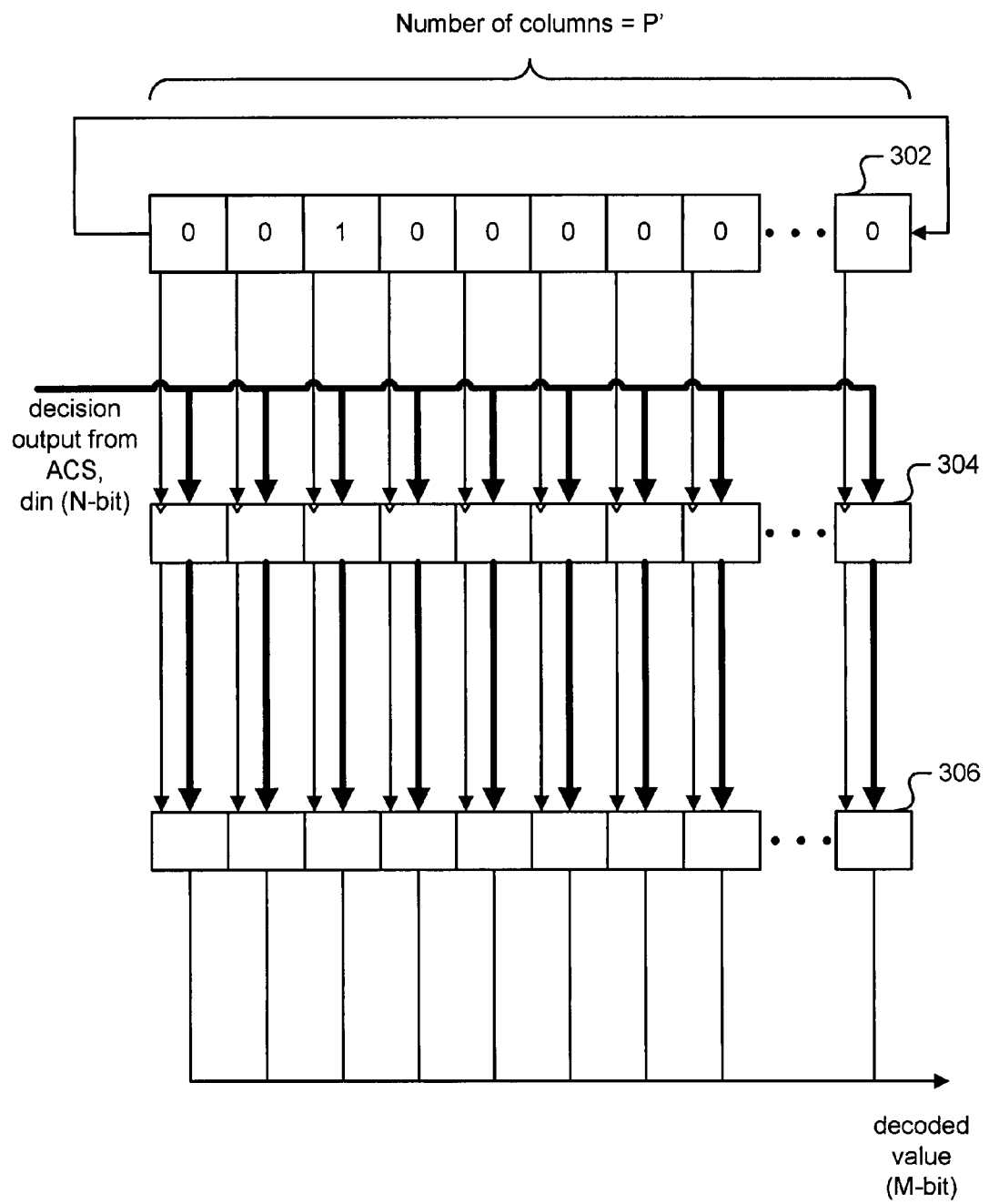
FIG. 3 is a block diagram illustrating an embodiment of an SPM unit using a low power Viterbi trace back architecture.

FIG. 3 is a block diagram illustrating an embodiment of an SPM unit using a low power Viterbi trace back architecture. In some embodiments, the device of FIG. 3 is included in unit 106 of FIG. 1. In the example shown, a sliding 1-bit shift register 302 of length P' is used to enable or clock a series of P' registers 304 of N-bit width, where P' is the survivor path length plus some margin to account for processing delays or to relax timing constraints. The N-bit decision outputs from ACS 104 are clocked into the series of P' registers 304. The output of the sliding 1-bit shift register 302 and series of P' registers 304 are the input to a combinational logic structure called a "multiplexer chain" 306. The output of multiplexer chain 306 is the M-bit Viterbi decoded value.

In comparison to the register exchange technique, the low power Viterbi trace back architecture has lower power consumption because the sliding 1-bit shift register 302 only allows a single N×1 register to be clocked each cycle, rather than the entire N×P' registers clocked every cycle in the register exchange technique.

In the event that the Viterbi detector input sequence has high signal to noise ratio (SNR), the survivor path will merge much earlier than the worst case survivor path length, resulting in a lot less switching activities in the multiplexer chain. For example, if all the survivor paths merge within 10 time steps, every time a new set of ACS decision outputs are clocked into a register pointed at by the shift register, switching activities only propagate to the 10 multiplexer columns to the right of the newly changed decision.

The low power Viterbi trace back architecture has only a slightly higher latency than the register exchange technique, because it requires the decoded value to be propagated through the multiplexer chain 306. The actual extra latency depends on the speed of the multiplexer chain, the system clock frequency and the survivor path length.

Figure 4:
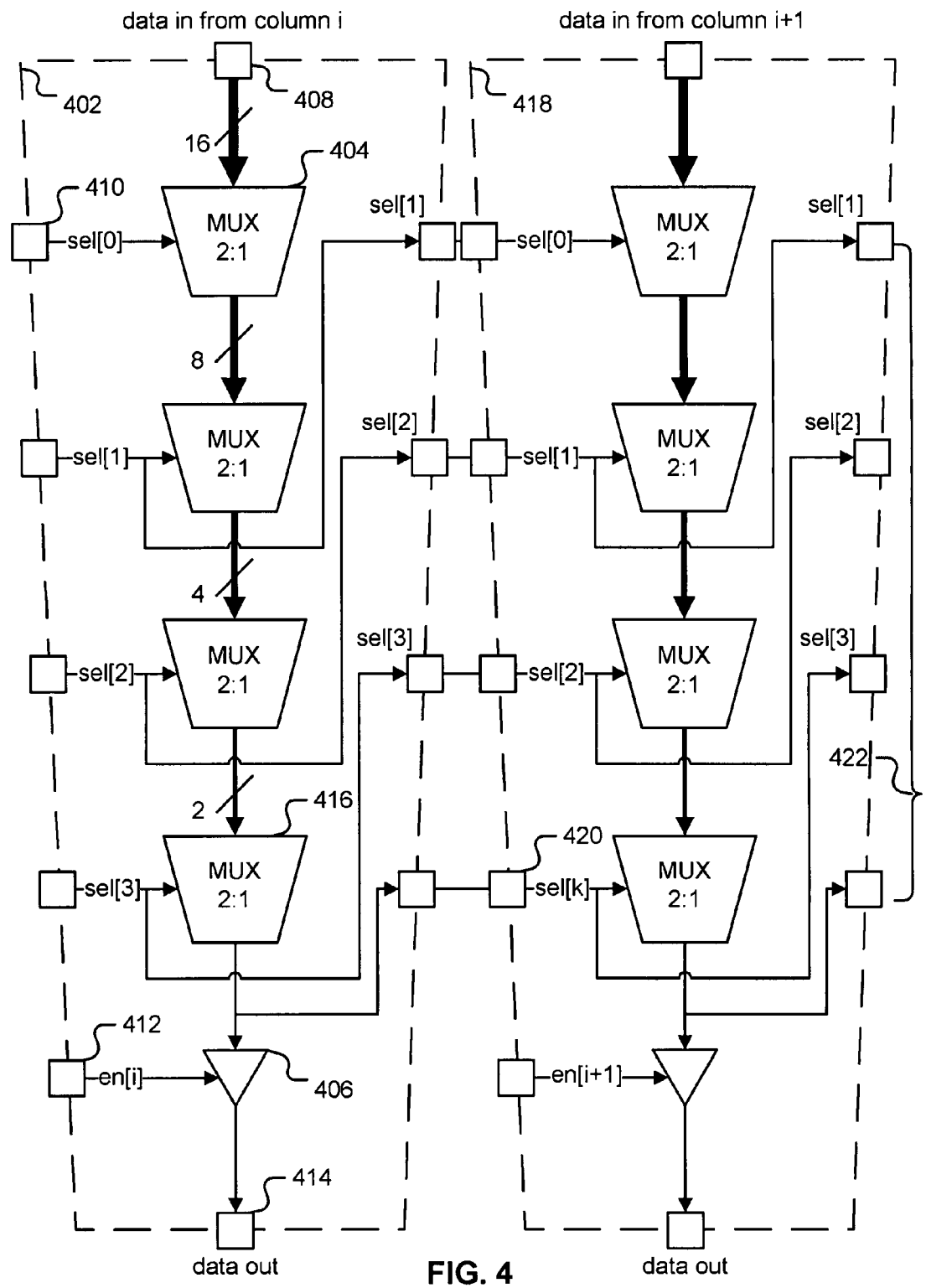
FIG. 4 is a block diagram illustrating an embodiment of a multiplexer chain in the low power Viterbi trace back architecture for 16-bit decision outputs.

FIG. 4 is a block diagram illustrating an embodiment of a multiplexer chain in a low power Viterbi trace back architecture for 16-bit decision outputs. In the example shown, each multiplexer 402, also represented as 306 in FIG. 3, comprises of four cascaded 2:1 multiplexers 404 with an enabling buffer 406. In some embodiments enabling buffer 406 may be a tristate buffer. In embodiments with N-bit decision outputs, the multiplexer 402 will have a similar structure with Z cascaded multiplexers 404, where Z is the logarithm of N in base 2.

The input from the N-bit register 304 for column i is routed into multiplexer 402 at input port 408 as shown in FIG. 4. The 4-bit select lines 410 are broken out and each input as the switch for each of the cascaded 2:1 multiplexers 404. In the example shown, the 4-bit select lines 410 in the left-most column are connected to the outputs 422 of the right-most column. The enable line for column i from the sliding 1-bit shift register 302 is used as the enable input 412 for enabling buffer 406. Finally, when enable input 412 is asserted, the output of enabling buffer 406 is brought out as the Viterbi decoded value at multiplexer chain output 414. Because of the nature of sliding 1-bit shift register 302, only one column will be enabled at any time. Thus, a plurality of columns can share a common data out line since only one column will be driving or outputting a value at a time. In some embodiments, a multiplexer is used rather than using enabling buffers connected to common or shared data out line.

The multiplexer chain is created by chaining multiplexer 402 for each column, such that subsequent multiplexer 418 has a different series of 4-bit select lines. In the example shown, the multiplexer 402 for column i can be connected to the multiplexer 418 for column i+1 such that:

The select line sel[0] for multiplexer 418 is chained to the select line sel[1] for multiplexer 402;

The select line sel[1] for multiplexer 418 is chained to the select line sel[2] for multiplexer 402;

The select line sel[2] for multiplexer 418 is chained to the select line sel[3] for multiplexer 402; and The select line sel[3] for multiplexer 418 is connected to the output of the last cascaded 2:1 multiplexer 416 in multiplexer 402.

By rearranging the multiplexer and register structure of the register exchange technique into the low power Viterbi trace back architecture, power can be reduced while incurring only a minimal increase in delay. The application of the low power Viterbi trace back architecture can include both communications devices and storage devices, including a disc drive system.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of obtaining a Viterbi decoded value, including:

enabling one of a plurality of buffer elements using an enabling input line, wherein at least one other of the plurality of buffer elements is not enabled;

storing a decision output in the enabled one of the plurality of buffer elements;

routing the stored decision output from the one of the plurality of buffer elements through a plurality of multiplexers cascaded together; and obtaining a Viterbi decoded value from an output of the cascaded plurality of multiplexers using the enabling input line.

2. The method as recited in claim 1, wherein the plurality of buffer elements includes a circular buffer.

3. The method as recited in claim 1, wherein the decision output stored in the one of the plurality of buffer elements is a plurality of bits.

4. The method as recited in claim 1, wherein all other buffer elements in the plurality are not enabled when the one of the plurality of buffer elements is enabled.

5. The method as recited in claim 1, wherein the Viterbi decoded value is a bit.

6. The method as recited in claim 1, wherein the Viterbi decoded value is used in a communications device.

7. The method as recited in claim 1, wherein the Viterbi decoded value is used in a storage device.

8. A system for obtaining a Viterbi decoded value, including:

a processor; and a memory coupled with the processor, wherein the memory is configured to provide the processor with instructions which when executed cause the processor to:

enable one of a plurality of buffer elements using an enabling input line, wherein at least one other of the plurality of buffer elements is not enabled;

store a decision output in the enabled one of the plurality of buffer elements;

route the stored decision output from the one of the plurality of buffer elements through a plurality of multiplexers cascaded together; and obtain a Viterbi decoded value from an output of the cascaded plurality of multiplexers using the enabling input line.

9. The system as recited in claim 8, wherein at least one other of the plurality of buffer elements is not changed when the decision output is stored in the one of the plurality of buffer elements, and wherein to store a decision output to a buffer element consumes more power than a buffer element that is not changing.

10. The system as recited in claim 8, wherein the plurality of buffer elements includes a circular buffer.

11. The system as recited in claim 8, wherein the decision output stored in the one of the plurality of buffer elements is a bit.

12. The system as recited in claim 8, wherein the decision output stored in the one of the plurality of buffer elements is a plurality of bits.

13. The system as recited in claim 8, wherein the decision output stored in the one of the plurality of buffer elements is a symbol.

14. The system as recited in claim 8, wherein each buffer element in the plurality of buffer elements includes a register.

15. The system as recited in claim 8, wherein all other buffer elements in the plurality are not enabled when the one of the plurality of buffer elements is enabled.

16. The system as recited in claim 8, wherein the Viterbi decoded value is a bit.

17. The system as recited in claim 8, wherein the Viterbi decoded value is a plurality of bits.

18. The system as recited in claim 8, wherein the Viterbi decoded value is used in a communications device.

19. The system as recited in claim 8, wherein the Viterbi decoded value is used in a storage device.

20. The system as recited in claim 8, wherein the Viterbi decoded value is used in a storage device, including a disc drive system.

21. The system as recited in claim 8, wherein the enabling input line comprises an output of a shift register.

22. The system as recited in claim 21, wherein obtaining the Viterbi decoded value from the output of the cascaded plurality of multiplexers comprises enabling an enabling buffer coupled to the output of the cascaded plurality of multiplexers with the output of the shift register.

* * * * *